United States Patent [19]
Mihailovits et al.

[11] Patent Number: 5,912,587
[45] Date of Patent: Jun. 15, 1999

[54] ACTIVE FILTER STACK

[75] Inventors: Nicholas Mihailovits, Sale; Trevor P Beatson, Manchester, both of United Kingdom

[73] Assignee: Mitel Semiconductor Limited, United Kingdom

[21] Appl. No.: 08/739,418

[22] Filed: Oct. 29, 1996

[30] Foreign Application Priority Data

Nov. 1, 1995 [GB] United Kingdom .................... 9522365
Nov. 1, 1995 [GB] United Kingdom .................... 9522366

[51] Int. Cl.$^6$ .............................. H03F 3/45; H03F 3/04; H03F 3/68
[52] U.S. Cl. ........................ 330/252; 330/303; 330/311
[58] Field of Search ................................ 330/252, 302, 330/305, 306, 310, 311, 303; 327/553, 557, 558, 559

[56] References Cited

U.S. PATENT DOCUMENTS

| 3,678,404 | 7/1972 | Blom et al. ........................ 330/252 X |
| 4,514,704 | 4/1985 | Curtis . |
| 5,225,790 | 7/1993 | Noguchi et al. .................... 330/306 X |

FOREIGN PATENT DOCUMENTS 0 352 790 1/1990 European Pat. Off. .
1 120 592 7/1968 United Kingdom .

OTHER PUBLICATIONS

EDN Electrical Design News, vol. 32, No. 5, Mar. 1986, Newton, Massachusetts, pp. 223–0232, XP002024714, Art Kapoor, et al., "Diverse Circuits Exploit Matching in Quad–Transistor IC".
IBM Technical Disclosure Bulletin, vol. 29, No. 9, Feb. 1987, New York, pp. 3851–3852, XP002024715, "General–Purpose Time–Domain Equalizer".

Primary Examiner—Robert Pascal
Assistant Examiner—Patricia Nguyen
Attorney, Agent, or Firm—Kirschstein, et al.

[57] ABSTRACT

Active filter circuit 1 consists of five filter stages 70–74 cascoded between a voltage supply and ground potential. The circuit has two major current paths, the first through the collector-emitter paths at transistors 31, 33, 35, 37 and 39, the second through transistors 32, 34, 36, 38 and 40. Each major current path is driven by a current source 61, 62. In operation, a differential input signal is applied to the base electrodes of transistors 31, 32 and a differential output signal is taken from the emitters of transistors 39, 40. The transistors 33, 34 of stage 71 have their collector and base electrodes cross-coupled. Transistors 35–40 of stages 72–74 are connected in the same manner. In another embodiment (FIG. 3, not shown) a cut-off frequency is varied under control of controllable current sources.

12 Claims, 5 Drawing Sheets

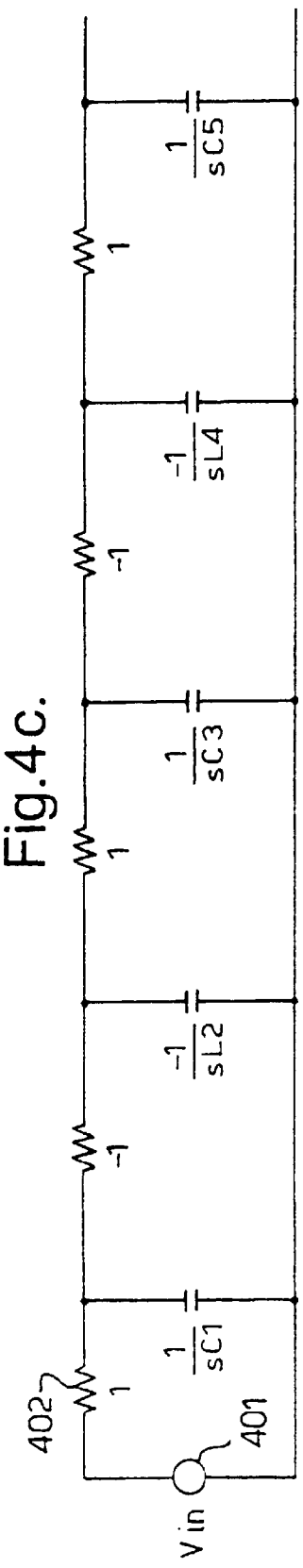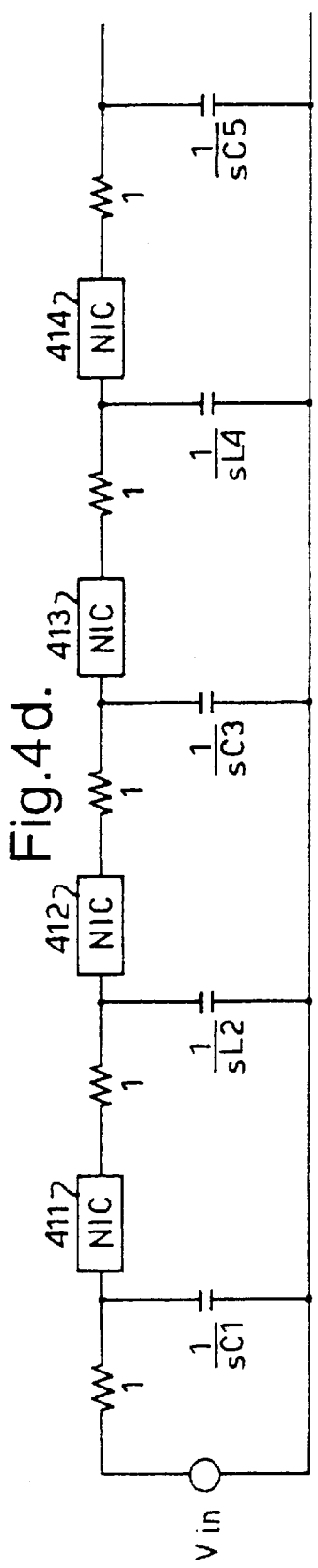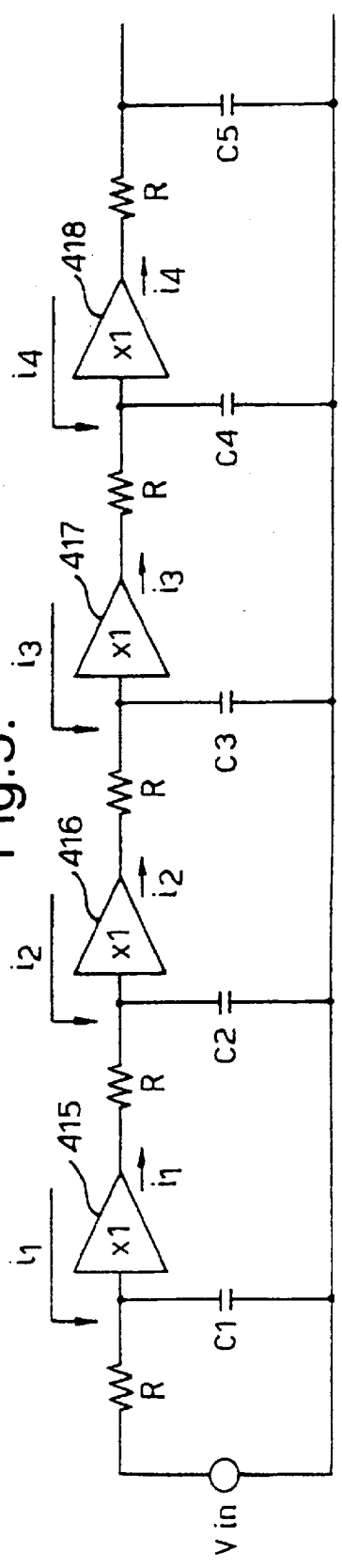

ACTIVE FILTER STACK

BACKGROUND OF THE INVENTION

This invention relates to active filters and more particularly to active filter circuits with differential inputs and outputs.

Prior art active filter circuits commonly involve the use of complex circuit elements such as operational amplifiers or transconductance amplifiers. The use of such complex elements in differential filters can necessitate the use of additional common mode stabilisation circuitry as well as imposing a heavy restriction on the frequency range of the filter.

There exists the need for a low-cost, simple structured active filter circuit that can operate at high frequencies and is suitable for monolithic implementation.

SUMMARY OF THE INVENTION

In accordance with the present invention there is provided an active filter circuit comprising a plurality of stages each including first and second transistors, the respective first transistors of said plurality of stages having their major current paths connected in a first series path and the respective second transistors having their major current paths connected in a second series path, and the first and second transistors of at least one of said plurality of stages having their base and collector electrodes cross-coupled.

BRIEF DESCRIPTION OF THE DRAWINGS

Embodiments of the present invention will now be described, by way of example, with reference to the accompanying drawings, of which:

FIGS. 4, 4a, 4b, 4c, 4d, 5, 6 and 7 show steps in a network transformation by which a filter circuit according to the present invention can be derived from a theoretical filter circuit.

DETAILED DESCRIPTION OF THE PREFERRED EMBODIMENTS

Figure 1:
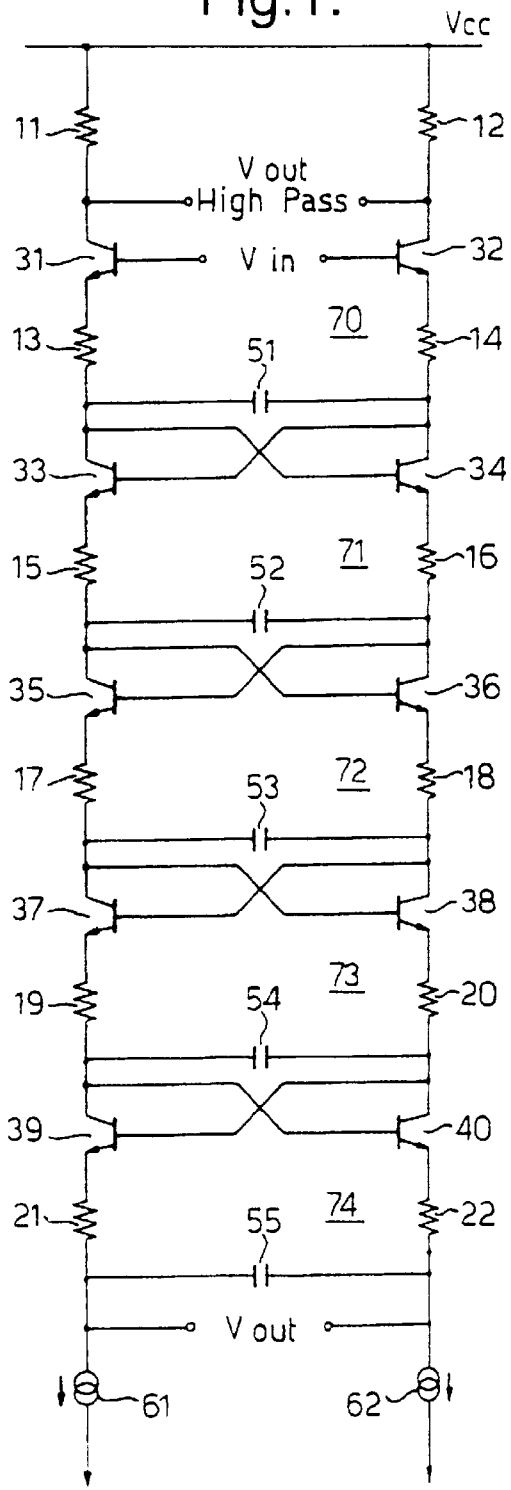
FIG. 1 shows a stacked low pass filter in accordance with the present invention.

Referring to the drawings, FIG. 1 shows a stacked fifth order low pass filter circuit in accordance with the present invention. The filter circuit 1 comprises five cascoded stages, the differential output of one stage being used as the differential input of the following stage. There are two major current paths, the first major current path being through the collector-emitter paths of transistors 31, 33, 35, 37, 39, the second major current path being that through the collector-emitter paths of transistors 32, 34, 36, 38 and 40.

The first stage 70 of the filter circuit comprises npn transistors 31, 32, resistors 13, 14 and capacitor 51. First stage 70 is separated from the filter circuit voltage supply by resistors 11 and 12. The filter circuit input is applied to the base electrodes of transistors 31 and 32, there is no cross-coupling in first stage 70 of the filter circuit. The differential output of first stage 70 is the voltage across capacitor 51, this first stage output forming the differential input of second stage 71. Each input signal of second stage 71 is cross-coupled to the base electrode of the npn transistor 33 or 34 controlling the other major current path. The transistors 33 and 34 here behave as voltage followers, which allows the use of higher frequency signals than can be handled by many conventional active filter circuits.

It can be seen that the third, fourth and final stages 72, 73, 74 of the filter circuit, terminating in capacitors 53, 54 and 55 respectively, have similar structures to that of second stage 71. The outputs of the final stage 74 are connected to ground by way of current sources 61 and 62. The filter circuit low pass output is taken across capacitor 55 of the final stage 74. A high pass output may be taken across the collectors of transistors 31 and 32, if required.

Each stage 70–74 of the circuit has a first order transfer function. The five stage circuit 1 will therefore have a fifth order transfer function from which the frequency and phase characteristics of the filter can be calculated.

A network transformation by which the element values of a filter circuit in accordance with the present invention can be derived from those of a conventional LRC filter circuit will now be described, as an aid to understanding the invention, with reference to FIGS. 4, 4a, 4b, 4c, 4d, 5, 6 and 7.

Figure 4:
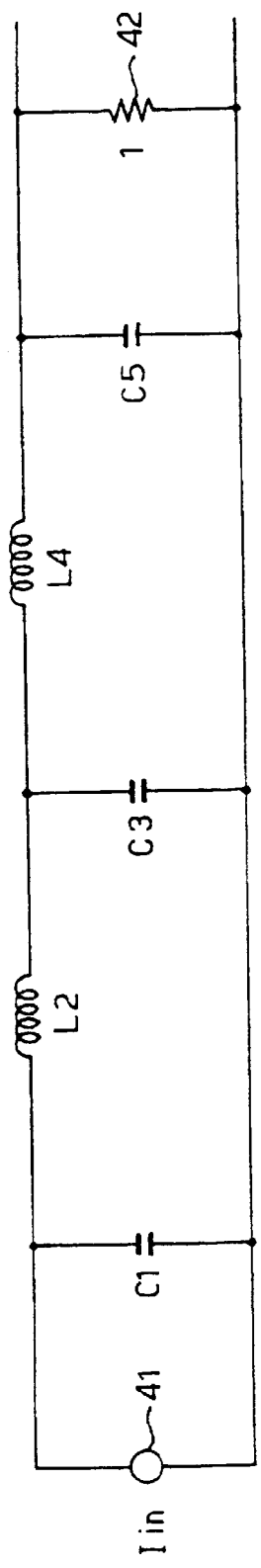
Figure 4A:
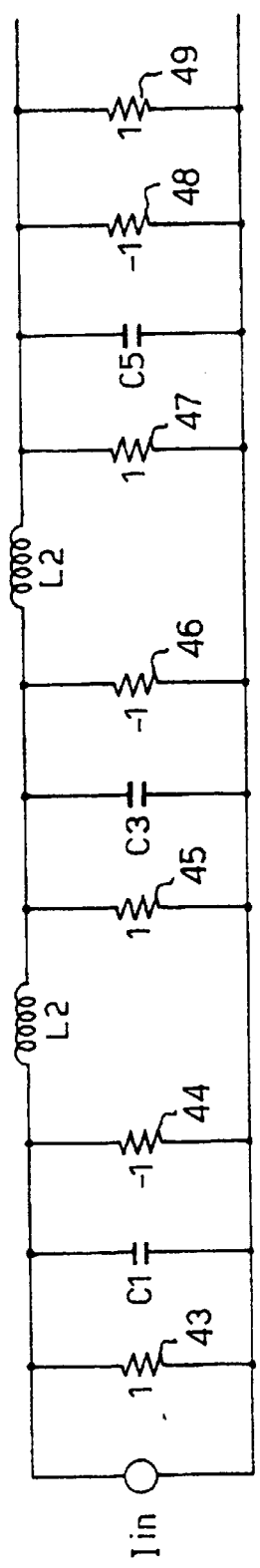
Figure 4B:
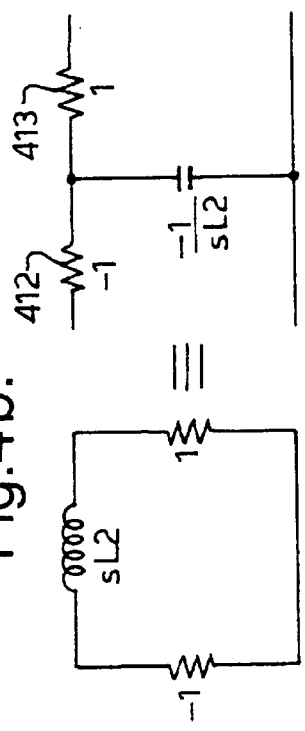

FIG. 4 shows a basic LRC filter having a current source drive 41 and a 1 Ohm termination resistor 42. Noting that the combined resistance of parallel connected 1 Ohm and —1 Ohm resistors would be infinity, it can be seen that the addition of such parallel resistors to ground from the ends of each inductor L2, L4 would have no effect on the overall response of the filter. The circuit resulting from the insertion of these resistors 43–48 is shown in FIG. 4a. The inductors L2, L4 of this circuit can now be replaced by capacitors using a delta-star transformation. This transformation is shown, in the Laplace domain, in FIG. 4b. The two resistors 48, 49 at the terminating portion of FIG. 4a can be replaced by the equivalent open circuit termination. The current source 41 and parallel resistor 43 can be replaced by the equivalent voltage source 401 with series resistor 402 of FIG. 4c. It will be noted that the resultant circuit of FIG. 4c contains only positive and negative value resistors and capacitors.

In this transformation, the requirement for negative value components can be removed by the use of negative impedance converters (NICs). These are ideal circuit elements which effectively present the negative of the impedance present at their output when viewed from their input. By inserting NICs throughout the network of FIG. 4c, the negative value components can be removed. This is shown in FIG. 4d.

Figure 6:
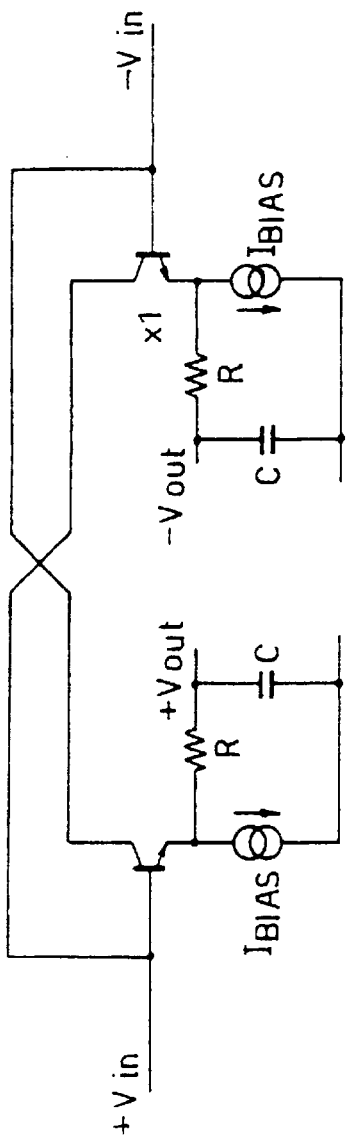

Each of the NICs 411–414 of FIG. 4d can be replaced by a unity gain voltage follower with load sensing current feedback, resulting in the circuit of FIG. 5. The implementation of these voltage followers 415–418 with current biased bipolar transistors that results in the filter circuit of FIG. 1, where the cross-coupled differential structure provides the required negative current feedback for the voltage followers. The structure can be thought of in terms of two half circuits, one driven by $+V_{in}$ and the other by $-V_{in}$. The current and voltage in one half circuit will be the opposite to that in the other half circuit. These half circuits can be represented as emitter follower circuits having respective constant current sources from their emitter electrodes to ground, series resistors from their emitter electrodes to respective outputs and capacitors from their outputs to ground. These two half circuits are cross coupled to provide the required feedback, as shown in FIG. 6.

Figure 7:
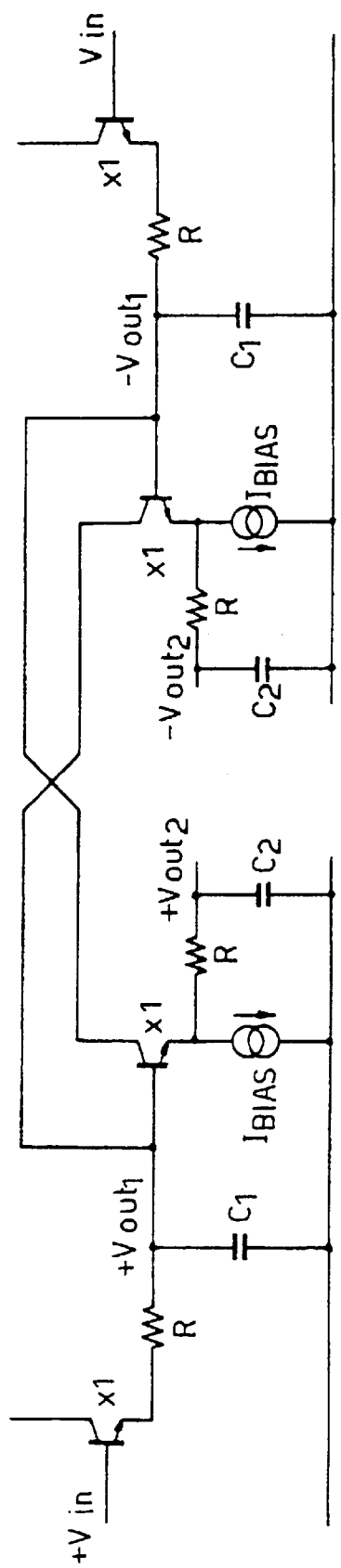

In stacking two filter stages of this type, as shown in FIG. 7, current is saved because subsequent filter stages operate on the bias current used to drive the lowest filter stage. This current efficient design is most important where the power supply is limited, e.g. in battery powered fixed and mobile applications.

By connecting the capacitors of FIG. 7 differentially, instead of the single ended arrangement shown, a much more compact filter circuit can be obtained. This results in a two stage equivalent of the five stage filter circuit shown in FIG. 1.

As will be appreciated, the capacitors need not be connected differentially but could be connected to ground at one end on each side of the stack, as in FIG. 7. This is particularly useful for monolithic implementations where fully floating capacitors are not supported.

By involving only emitter followers in the circuit design and avoiding the use of such devices as operational amplifiers and transconductance amplifiers, much higher operating frequencies are possible.

Because only a.c. feedback mechanisms operate within the circuit, the filter is much less sensitive to d.c. offsets than prior art filters.

The use of transistors as voltage followers, rather than using transconductance amplifiers and the like, ensures that the d.c. gain of the filter as seen at the low pass output is unity.

The fact that the common voltage at each node is defined, in contrast to existing transconductor/capacitor filter implementations, eliminates the need for additional common mode stabilisation circuitry.

Because there is a correspondence between the conventional LCR filters and that of the present invention, component values required for the filter implementations are easily calculable.

The active filter stacking arrangement of the present invention is not limited to use in low and high pass fillers such as that shown in FIG. 1, but is equally applicable to all other filter types.

Figure 2:
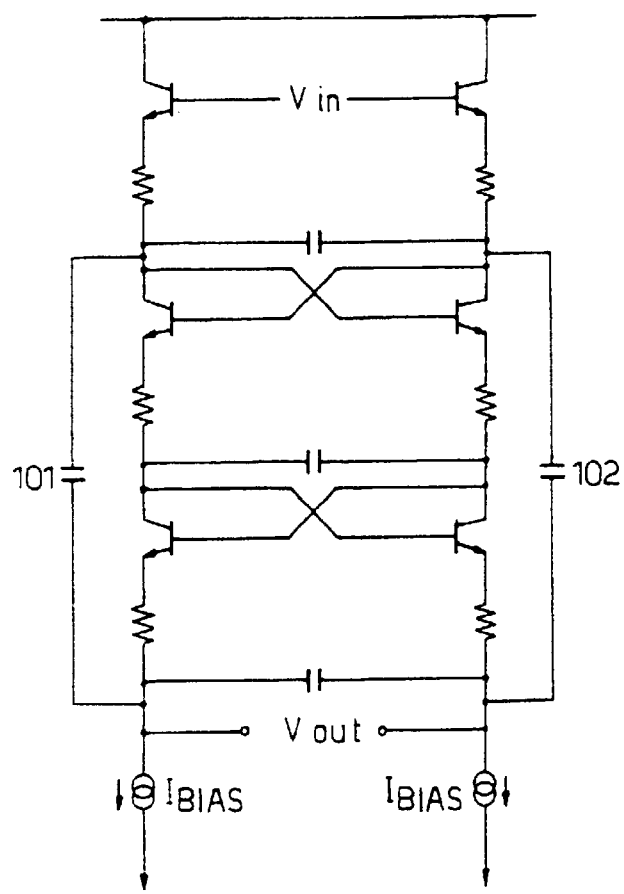
FIG. 2 shows a stacked elliptic filter in accordance with the present invention.

FIG. 2 is an example of a third order eliptic filter implemented with cross-coupled bipolar transistors. The circuit elements are essentially the same except for the addition of capacitors 101 and 102, connected to cause the filter to show a gain of zero at a finite frequency.

Figure 3:
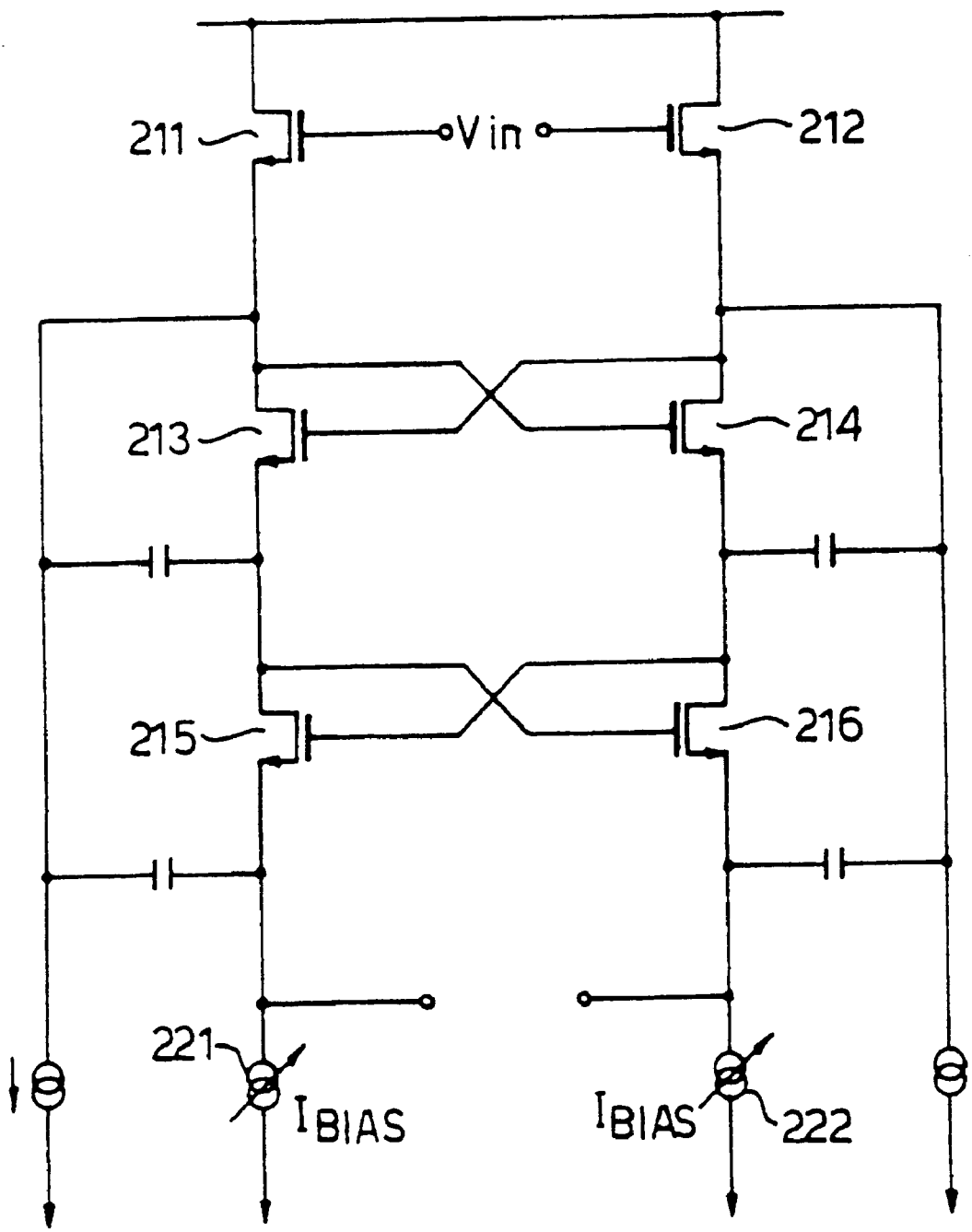
FIG. 3 shows a tunable all pass stacked filter in accordance with the present invention.

FIG. 3 shows an example of how a third order all-pass filter can be constructed. Capacitors 201, 202, 203, 204 give the filter its frequency dependent-phase-adjusting characteristics.

FIG. 3 is also used to show that semiconductor devices other than npn bipolar transistors can be used in the filter implementation. Field effect transistors 211–216 are used in place of npn transistors, being similarly operated as voltage followers, with their control, source and drain electrodes being connected corresponding to the base, emitter and collector electrodes of the bipolar transistors.

FIG. 3 also illustrates a way in which the cut-off frequency of a filter constructed in accordance with the invention can be controlled. The fixed resistors present in the filters of FIGS. 1 and 2 have been removed, the circuit being operated using the dynamic output impedance of the transistors themselves. Since this impedance is a function of the d.c. bias current, the filter cut off frequency is variable under control of the current sources 221 and 222.

As will be appreciated by a man skilled in the art, the differential nature of the circuit offers increased noise immunity and linearity. Filter circuits in accordance with the present invention are equally applicable to discrete and monolithic implementation.

We claim:

1. An active filter circuit, comprising: a plurality of stages each including first and second transistors, the respective first transistors of said plurality of stages having their major current paths connected in a first series path, and the respective second transistors in said plurality of stages having their major current paths connected in a second series path, the first and second transistors in at least one stage of said plurality of stages having their first and second main electrodes and their control electrodes cross-coupled to form a negative impedance converter, the first and second main electrodes of the first transistor of said at least one stage being connected to first and second capacitance means respectively, and the first and second main electrodes of the second transistor of said at least one stage being connected to third and fourth capacitance means respectively.

2. The active filter circuit in accordance with claim 1, in which the first and the third capacitance means comprise first and second electrodes respectively of a first capacitor; and the second and the fourth capacitance means comprise the first and second electrodes respectively of a second capacitor.

3. The active filter circuit in accordance with claim 1, in which the first and the second capacitance means comprise first and second electrodes respectively of a first capacitor; and the third and the fourth capacitance means comprise the first and the second electrodes respectively of a second capacitor.

4. The active filter circuit in accordance with claim 1, in which a first of said plurality of stages comprises a filter circuit input stage, and in which differential input signals are applied to the control electrodes of the first and second transistors of said first stage, and in which the second main electrodes of said first and second transistors of said first stage are connected to a voltage supply.

5. The active filter circuit in accordance with claim 4, wherein the second main electrodes of said first and second transistors are connected to the voltage supply by way of respective resistive elements.

6. The active filter circuit in accordance with claim 1, in which a final one of said plurality of stages comprises a filter circuit output stage, and in which the first main electrodes of the first and second transistors of said final stage are connected both to ground potential by way of respective current sources, and to respective output terminals of the filter circuit.

7. The active filter circuit in accordance with claim 6, wherein the first main electrodes of said first and second transistors of said final stage are connected to said current sources and said filter circuit output stage by way of respective resistive elements.

8. The active filter circuit in accordance with claim 6, wherein the current sources are electronically controllable current sources which are controllable so as to change filter characteristics.

9. The active filter circuit in accordance with claim 8, wherein one of said filter characteristics is a cut-off frequency.

10. The active filter circuit in accordance with claim 1, wherein both the first and the second transistor of at least one of said filter stages have their first main electrode connected to ground potential by a respective capacitor.

11. The active filter circuit in accordance with claim 10, wherein said at least one filter stage further comprises first and second resistive elements connected respectively between the first main electrodes of the first and the second transistors of said at least one stage and said respective capacitor.

12. The active filter circuit in accordance with claim 1, wherein said at least one filter stage further comprises first and second resistive elements connected respectively between the first main electrodes of the first and the second transistors of said at least one stage and their associated capacitance means.

* * * * *